United States Patent
Luo et al.

(10) Patent No.: US 9,685,781 B2
(45) Date of Patent: Jun. 20, 2017

(54) SOLAR PHOTOVOLTAIC SYSTEM AND A METHOD FOR ENERGY HARVEST OPTIMIZATION THEREOF AND A METHOD FOR FAULT DETECTION THEREOF

(71) Applicant: Altenergy Power System, Inc., Zhejiang (CN)

(72) Inventors: Yuhao Luo, Zhejiang (CN); Zhimin Ling, Zhejiang (CN)

(73) Assignee: Altenergy Power System, Inc., Zhejiang (CN)

( * ) Notice: Subject to any disclaimer, the term of this patent is extended or adjusted under 35 U.S.C. 154(b) by 528 days.

(21) Appl. No.: 14/181,161

(22) Filed: Feb. 14, 2014

(65) Prior Publication Data

US 2014/0159763 A1 Jun. 12, 2014

Related U.S. Application Data

(63) Continuation of application No. PCT/CN2012/076369, filed on Jun. 1, 2012.

(30) Foreign Application Priority Data

Aug. 22, 2011 (CN) .......................... 2011 1 0241669

(51) Int. Cl.
*H02J 1/00* (2006.01)
*G01R 31/26* (2014.01)
(Continued)

(52) U.S. Cl.
CPC ............... *H02J 1/00* (2013.01); *G01R 31/26* (2013.01); *H02J 1/102* (2013.01); *H02J 3/385* (2013.01);
(Continued)

(58) Field of Classification Search
CPC ... H02J 1/00; H02J 1/102; H02J 3/385; H02S 50/10; H02S 10/00; H02S 50/00; G01R 31/26; Y10T 307/549; Y02E 10/58
(Continued)

(56) References Cited

U.S. PATENT DOCUMENTS

2010/0263711 A1* 10/2010 Kanai ....................... G05F 1/67
136/246
2010/0327659 A1 12/2010 Lisi et al.
(Continued)

FOREIGN PATENT DOCUMENTS

CN 101981524 A 2/2011
CN 102075104 A 5/2011
(Continued)

OTHER PUBLICATIONS

International Search Report mailed Sep. 13, 2012 in Int'l Patent Application No. PCT/CN2012/076369, 3 pages. English Translation version only.

*Primary Examiner* — Billy Lactaoen
(74) *Attorney, Agent, or Firm* — Kilpatrick Townsend & Stockton LLP

(57) ABSTRACT

This invention provides a solar photovoltaic system, comprising: a plurality of photovoltaic assemblies, for harvesting solar energy to generate DC currents; a plurality of micro-optimizers having input terminals coupled to the photovoltaic assemblies and having output terminals connected in series with each other, for optimizing output currents and/or output voltages of the photovoltaic assemblies, to generate maximum power; a manager configured to communicate with the plurality of micro-optimizers, for managing operating states of the micro-optimizers; and an inverter coupled to one or more strings of the micro-optimizers, for converting the optimized DC currents into AC currents and outputting the AC currents to a power grid.

(Continued)

This invention further provides a method for energy harvest optimization and a method for fault detection of a solar photovoltaic system.

2 Claims, 4 Drawing Sheets

(51) Int. Cl.
*H02S 10/00* (2014.01)
*H02J 3/38* (2006.01)
*H02S 50/10* (2014.01)
*H02J 1/10* (2006.01)
*H02S 50/00* (2014.01)

(52) U.S. Cl.
CPC .............. *H02S 10/00* (2013.01); *H02S 50/10* (2014.12); *H02S 50/00* (2013.01); *Y02E 10/58* (2013.01); *Y10T 307/549* (2015.04)

(58) Field of Classification Search
USPC ..................................................... 324/761.01
See application file for complete search history.

(56) References Cited

U.S. PATENT DOCUMENTS

| | | | |
|---|---|---|---|
| 2011/0115300 A1* | 5/2011 | Chiang | H01L 31/02021 307/82 |
| 2013/0051106 A1* | 2/2013 | Kuo | H02M 7/5387 363/132 |
| 2014/0373894 A1* | 12/2014 | Stratakos | H02S 50/00 136/244 |

FOREIGN PATENT DOCUMENTS

| | | |
|---|---|---|
| CN | 102291052 A | 12/2011 |
| CN | 202197235 U | 4/2012 |

\* cited by examiner

SOLAR PHOTOVOLTAIC SYSTEM AND A METHOD FOR ENERGY HARVEST OPTIMIZATION THEREOF AND A METHOD FOR FAULT DETECTION THEREOF

CROSS-REFERENCE TO RELATED APPLICATIONS

This application is a continuation of International Patent Application No. PCT/CN2012/076369, filed Jun. 1, 2012, which claims priority to CN Patent Application No. 201110241669.6, filed Aug. 22, 2011, the disclosures of which are hereby incorporated in their entirety by reference for all purposes.

TECHNICAL FIELD

This invention relates to the field of solar photovoltaic technology, and more particularly, to a solar photovoltaic system and a method for energy harvest optimization thereof and a method for fault detection thereof.

BACKGROUND ART

Solar photovoltaic assemblies are typically connected in series to increase the voltage before inputting into an inverter, which generates an AC current to a power grid or for use by a device. Output current of the serial-connected photovoltaic assemblies is limited by the photovoltaic assembly with the lowest current, making acquire maximum energy from each photovoltaic assembly impossible.

Output voltage of the photovoltaic assembly varies in a wide range with the illumination conditions. At present, a typical inverter design may support a wide range of input voltages. Since conversion efficiency varies with input voltage, the overall conversion efficiency of the inverter is lower than that at an optimal voltage. Additionally, a significant input voltage variation may increase the stress of the components, thereby affecting reliability and lifetime of the inverter.

Also, maintenance for a serial-connected photovoltaic system is very difficult, since failure of any photovoltaic assembly may cause failure of a string of components, and determining the fault component is difficult and high cost.

SUMMARY

This invention intends to solve the technical problem of providing a solar photovoltaic system and a method for energy harvest optimization thereof and a method for fault detection thereof, so as to be capable of outputting a fixed DC voltage, while optimizing the energy harvesting of each solar photovoltaic assembly, thereby generating maximum power.

To solve the above technical problem, this invention provides a solar photovoltaic system, comprising:

a plurality of photovoltaic assemblies for harvesting solar energy to generate DC currents;

a plurality of micro-optimizers, having input terminals coupled to the photovoltaic assemblies and having output terminals connected in series with each other, for optimizing output currents and/or output voltages of the photovoltaic assemblies, to generate maximum power;

a manager configured to communicate with the plurality of micro-optimizers, for managing operating states of the micro-optimizers; and an inverter coupled to one or more strings of the micro-optimizers, for converting the optimized DC currents into AC currents and outputting the AC currents to a power grid.

Optionally, each of the micro-optimizers comprises:

an input detection circuit coupled to an input terminal of the micro-optimizer, for detecting parameters of current and/or voltage input into the micro-optimizer;

an output detection circuit coupled to an output terminal of the micro-optimizer, for detecting parameters of current and/or voltage output from the micro-optimizer;

a maximum power point tracking circuit coupled to the input detection circuit, for tracking a maximum power point of the photovoltaic assembly based on the parameters of the current and/or voltage input into the micro-optimizer, and generating a desired current and/or voltage control requirement;

a control circuit coupled to the input detection circuit, the output detection circuit and the maximum power point tracking circuit respectively, for generating a control signal according to the current and/or voltage control requirement;

a power conversion circuit coupled to the input terminal and output terminal of the micro-optimizer and to the control circuit, for receiving the control signal, and performing boost or buck conversion on an input current from the photovoltaic assembly; and a communication circuit coupled to the output detection circuit and the control circuit respectively, for receiving a management command from the manager and forwarding it to the control circuit, or feeding the input current, an input voltage, an input power, an output current, an output voltage, an output power, or a temperature of the micro-optimizer back to the manager.

Optionally, multiple strings of the micro-optimizers share the common manager, or each string of the micro-optimizers employs a manager separately.

Optionally, the manager communicates with the micro-optimizers using a wireless communication technology or a power-line communication technology.

To solve the above technical problem, this invention further provides a method for energy harvest optimization of a solar photovoltaic system, comprising the steps of:

A. reading a respective string output voltage desired for each string of micro-optimizers by a manager;

B. tracking a maximum power point for a photovoltaic assembly by each of micro-optimizers, such that the photovoltaic assembly can provide maximum power;

C. detecting parameters of input current and/or input voltage, and calculating acquired input power by each of the micro-optimizers;

D. calculating acquired output power according to the input power by each of the micro-optimizers;

E. transmitting the respective output power to the manager by all the micro-optimizers;

F. putting data on the output power for one string into one set based on numberings of the micro-optimizers by the manager;

G. calculating a sum of the output power for each string of micro-optimizers by the manager;

H. comparing the sum of output power obtained at present detection time with that obtained at last detection time, and if the difference is not larger than a threshold, returning back to the step E, otherwise proceeding to step I;

I. calculating a string output current desired for each string of micro-optimizers by the manager;

J. transmitting the desired string output current to the micro-optimizer corresponding to each photovoltaic assembly as a management command by the manager;

K. receiving the management command, and controlling its power conversion circuit for DC-DC conversion by the micro-optimizer, such that the string output current is as desired;

L. returning back to the step B, such that the method repeats in loops.

Optionally, for each string of micro-optimizers, the output power is calculated based on the following equation:

$$Po(T)=k*Pi(T)$$

wherein Po(T) is the output power of each string of micro-optimizers, Pi(T) is the input power of each string of micro-optimizers, and k is a preset power conversion efficiency.

Optionally, the power conversion efficiency is a constant near 1 or a variable as a function of the input power of each string of micro-optimizers.

Optionally, the string output current desired for each string of micro-optimizers is calculated based on the following equation:

$$Im(T)=Pm(T)/Vc$$

wherein Im(T) is the string output current desired for each string of micro-optimizers, Pm(T) is the sum of the output power for each string of micro-optimizers, and Vc is the string output voltage desired for each string of micro-optimizers.

Optionally, the string output voltage desired for each string of micro-optimizers is input manually into the manager, or is obtained by the manager through automatically detecting an inverter or DC power grid connected to the string of micro-optimizers.

To solve the above technical problem, this invention further provides a method for fault detection of a solar photovoltaic system, comprising the steps of:

a. transmitting the respective input parameters and output parameters to a manager by each micro-optimizer;

b. processing and analyzing the output parameters by the manager;

c. determining whether the output parameters are abnormal or not, if not, returning back to the step b, otherwise proceeding to step d;

d. processing and analyzing the input parameters by the manager;

e. determining whether the input parameters are abnormal or not, if not, determining that the micro-optimizer is in fault; otherwise determining that a photovoltaic assembly connected thereto is in fault;

f. alerting a fault alarm message.

Optionally, the input parameters and output parameters include: an input current, an input voltage, an input power, an output current, an output voltage and an output power of each micro-optimizer.

As compared with the prior art, this invention has the following advantages:

The solar photovoltaic system of the invention harvests the maximum power generated by each photovoltaic assembly, and various photovoltaic assemblies with different models and rated power, and even from different suppliers and of materials, may be used in the same photovoltaic system.

This invention allows the photovoltaic assemblies to be installed under different conditions, such as illumination, temperature, orientations, etc., thereby simplifying the design of the photovoltaic system.

The output voltage of a string of micro-optimizers in the invention may be set flexibly depending on different system requirements, and the fixed DC voltage output to the inverter may be set flexibly, thereby optimizing the performance of the inverter.

The invention may also detect the performance and failure of each photovoltaic assembly and micro-optimizer at any time.

DESCRIPTION OF FIGURES

The above and other features, properties and advantages of the invention will be more apparent from the following description made in conjunction with the drawings and embodiments, wherein.

DETAILED DESCRIPTION

The invention will be further described below in conjunction with the specific embodiments and the drawings. More details are set forth in the following description for better understanding of the invention, although it is apparent that the invention may be embodied in various manners other than that described herein. Those skilled in the art may make extension and deduction depending on the practical application situations without departing from the spirit of the invention. Thus, the scope of the invention is not intended to be limited by the contents of the specific embodiments.

Figure 1:
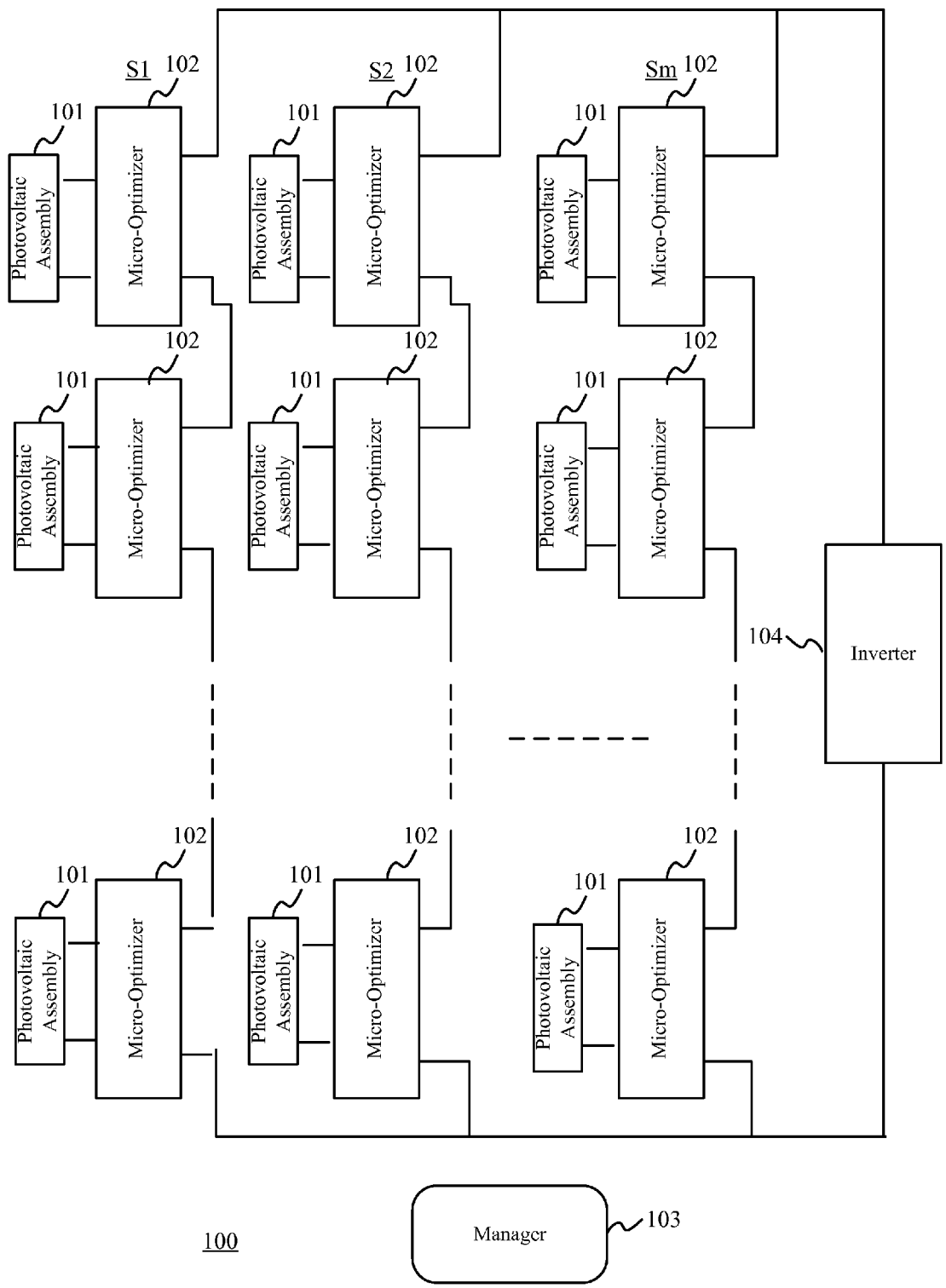
FIG. 1 is a modular structural schematic diagram of a solar photovoltaic system in an embodiment of the invention.

FIG. 1 is a modular structural schematic diagram of a solar photovoltaic system in an embodiment of the invention. As shown, the solar photovoltaic system 100 may include a plurality of photovoltaic assemblies 101, a plurality of micro-optimizers 102, a manager 103 and an inverter 104. The plurality of photovoltaic assemblies 101 are employed to harvest the solar energy to generate DC currents. The plurality of micro-optimizers 102 have input terminals coupled to the photovoltaic assemblies 101 respectively and have output terminals connected in series with each other, for optimizing the output currents and/or the output voltages of the photovoltaic assemblies 101, to generate maximum power. The manager 103 communicates with the plurality of micro-optimizers 102, for managing the operating states of the micro-optimizers 102. The inverter 104 is connected in parallel with one or more strings of micro-optimizers 102, for converting the optimized DC currents into AC currents and outputting the AC currents to a power grid. The manager 103 may communicate with the micro-optimizers 102 using a wireless communication technology or a power-line communication technology. Multiple strings of micro-optimizers 102 may share a common manager 103, or each string of micro-optimizers 102 may employ one manager 103 separately. The output of a micro-optimizer 102 is a DC current with a fixed voltage, which may be coupled directly to a DC power grid, or may be used by a DC device.

Figure 2:
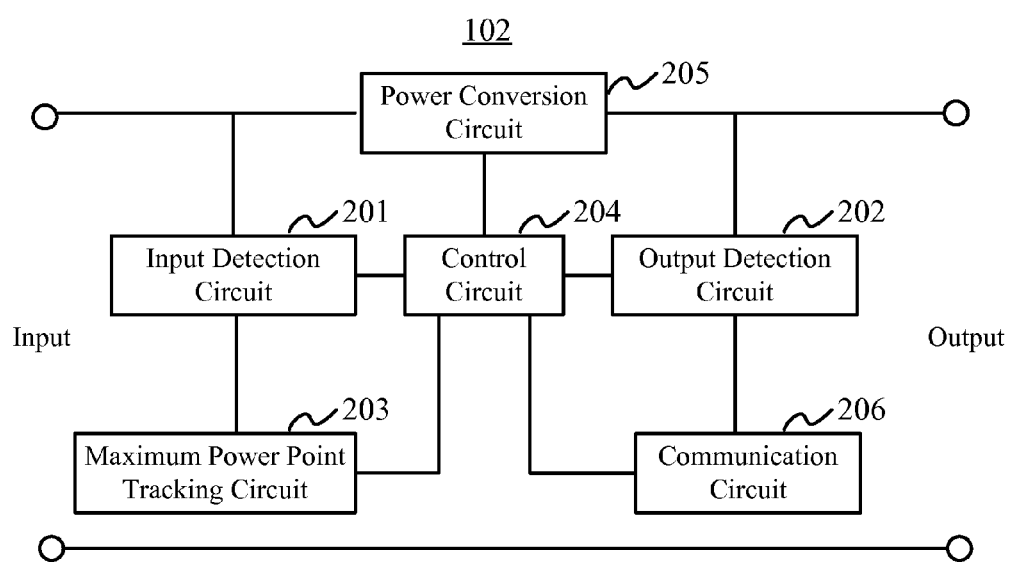
FIG. 2 is an internal modular structural schematic diagram of a micro-optimizer of a solar photovoltaic system in an embodiment of the invention.

FIG. 2 is an internal modular structural schematic diagram of a micro-optimizer of a solar photovoltaic system in an embodiment of the invention. As shown, the micro-optimizer 102 may include an input detection circuit 201, an output detection circuit 202, a maximum power point tracking circuit 203, a control circuit 204, a power conversion circuit 205 and a communication circuit 206. The input detection circuit 201 is coupled to an input terminal of the micro-optimizer 102, for detecting the parameters of the current and/or voltage input into the micro-optimizer 102. The output detection circuit 202 is coupled to an output terminal of the micro-optimizer 102, for detecting the parameters of the current and/or voltage output from the micro-optimizer 102. The maximum power point tracking circuit 203 is coupled to the input detection circuit 201, for tracking the maximum power point of the photovoltaic assembly 101 according to the parameters of the current and/or voltage input into the micro-optimizer 102, and generating a desired current and/or voltage control requirement. The control circuit 204 is coupled to the input detection circuit 201, the output detection circuit 202 and the maximum power point tracking circuit 203 respectively, for generating a control signal according to the current and/or voltage control requirement. The power conversion circuit 205 is coupled to the input terminal and output terminal of the micro-optimizer 102 and to the control circuit 204, for receiving the control signal, and performing boost or buck conversion on the input current from the photovoltaic assembly 101. The communication circuit 206 is coupled to the output detection circuit 202 and the control circuit 204 respectively, for receiving a management command from the manager 103 and forwarding it to the control circuit 204, or feeding data back to the manager 103, including the input current, the input voltage, the input power, the output current, the output voltage, the output power, or the micro-optimizer temperature, etc.

In this embodiment, the micro-optimizer 102 achieves the maximum input power by the loop control of the input detection circuit 201, the power conversion circuit 205, the output detection circuit 202, the control circuit 204 and the maximum power point tracking circuit 203. Similarly, the micro-optimizer 102 enables the output current to reach a desired output value by the loop control of the output detection circuit 202, the control circuit 204, and the power conversion circuit 205.

Figure 3:
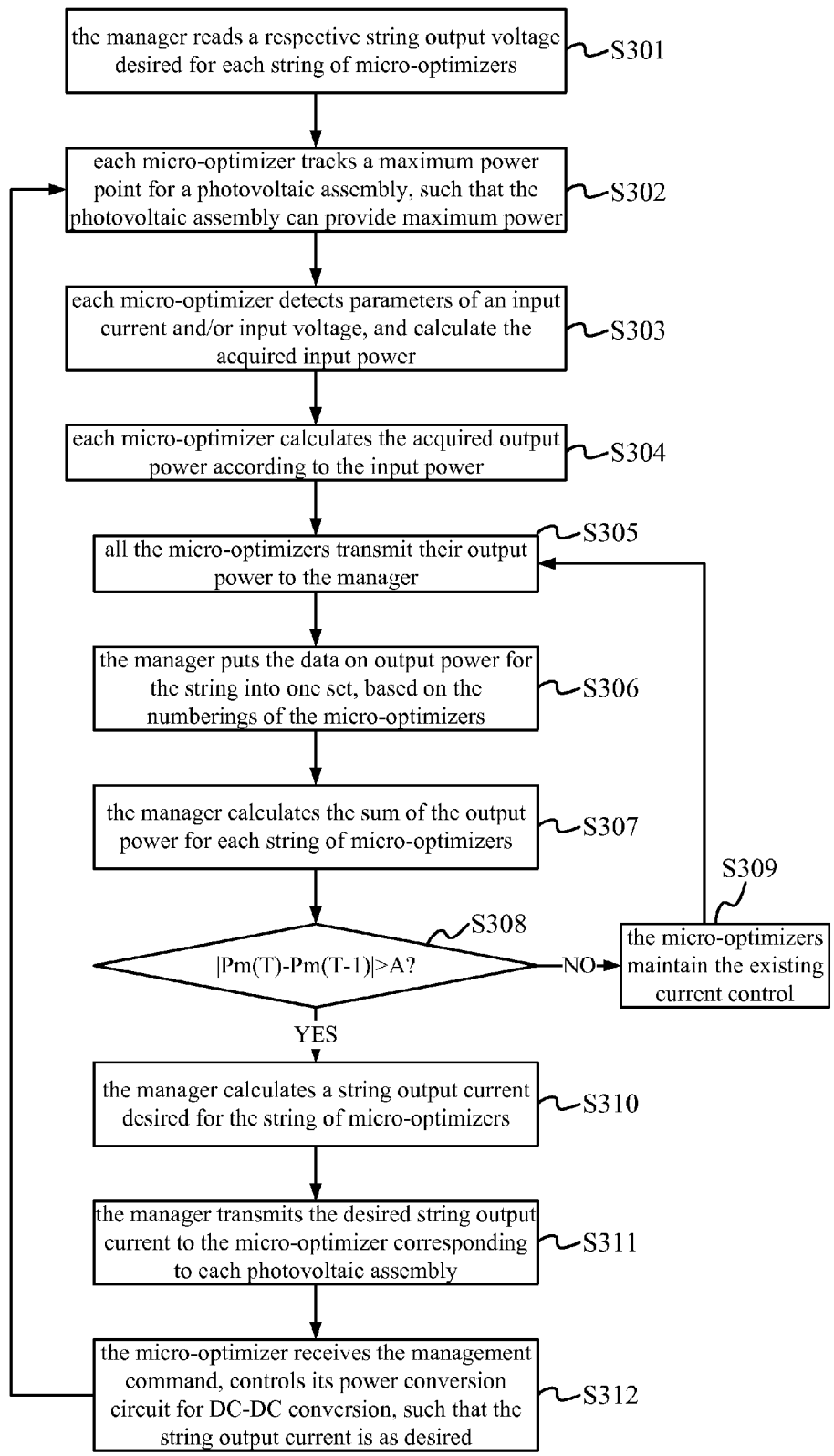
FIG. 3 is a flowchart diagram of a method for energy harvest optimization of a solar photovoltaic system in an embodiment of the invention.

FIG. 3 is a flowchart diagram of a method for energy harvest optimization of a solar photovoltaic system in an embodiment of the invention. As shown, the method for energy harvest optimization of the solar photovoltaic system may include the following steps:

Performing step S301, where the manager 103 reads a respective string output voltage Vc desired for each string of micro-optimizers 102, wherein the string output voltage Vc is the input voltage of a connected inverter, or a voltage of a connected DC power grid, wherein the string output voltage Vc may be input manually into the manager 103, or may be obtained by the manager 103 through automatically detecting the inverter 104 or the DC power grid connected to the string of micro-optimizers 102;

Performing step S302, where each micro-optimizer 102 tracks a maximum power point for a photovoltaic assembly 101, such that the photovoltaic assembly 101 can provide maximum power;

Performing step S303, where each micro-optimizer 102 detects parameters of an input current and/or input voltage, and calculate the acquired input power Pi(T), wherein T is the time for the current detection;

Performing step S304, where for each string of micro-optimizers 102, each micro-optimizer 102 calculates the acquired output power Po(T) according to the input power Pi(T), e.g., with the equation as following:

$$Po(T)=k*Pi(T)$$

wherein Po(T) is the output power of each string of micro-optimizers 102, Pi(T) is the input power of each string of micro-optimizers 102, and k is a preset power conversion efficiency, which is generally a constant near 1 or a variable as a function of the input power Pi(T) of each string of micro-optimizers 102;

Performing step S305, where all the micro-optimizers 102 transmit their output power Po(T) to the manager 103;

Performing step S306, where the manager 103 puts the data on output power Po(T) for the string into one set, based on the numberings of the micro-optimizers 102 that are stored at the installation of the solar photovoltaic system 100;

Performing step S307, where the manager 103 calculates the sum of the output power Po(T) for each string of micro-optimizers 102, wherein Pm(T)=sum(Po(T));

Performing step S308, where the output power sum Pm(T) obtained at the present detection time T is compared with the output power sum Pm(T−1) obtained at the last detection time T−1, and if the difference is not larger than a threshold A, step S309 is performed, where the micro-optimizers 102 maintain the existing current control, and then the method returns back to step S305; otherwise the method proceeds to step S310;

Performing step S310, where the manager 103 calculates a string output current Im(T) desired for each string of micro-optimizers 102, e.g., with the equation as following:

$$Im(T)=Pm(T)/Vc$$

wherein Im(T) is the string output current desired for the string of micro-optimizers 102, Pm(T) is the sum of the output power Po(T) for the string of micro-optimizers 102, and Vc is the string output voltage desired for the string of micro-optimizers 102;

Performing step S311, where the manager 103 transmits the desired string output current Im(T) to the micro-optimizer 102 corresponding to each photovoltaic assembly 101 as a management command;

Performing step S312, where the micro-optimizer 102 receives the management command, controls its power conversion circuit 205 for DC-DC conversion, such that the string output current Im(T) is as desired; then the method returns back to step S302, and the process repeats in loop.

Figure 4:
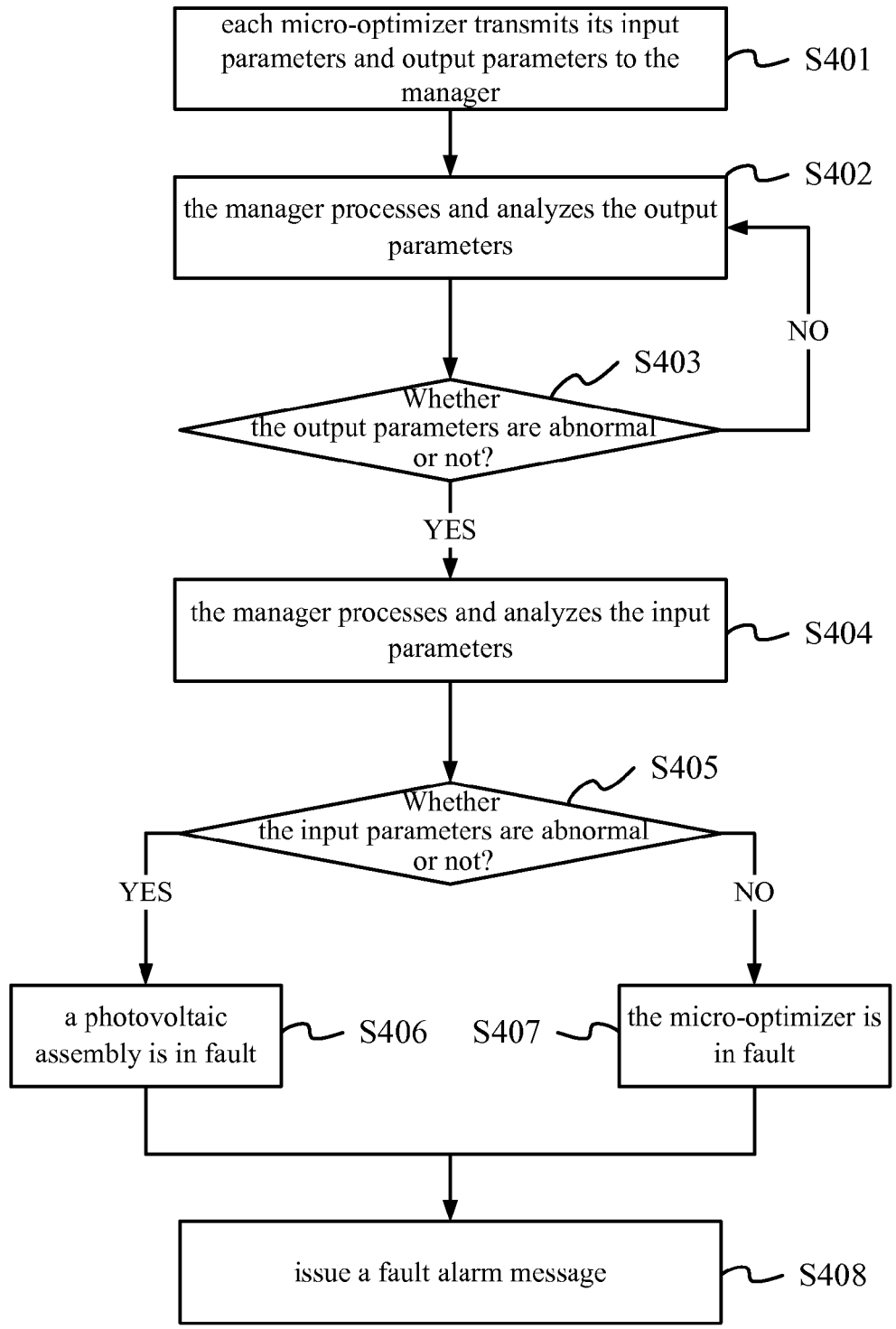
FIG. 4 is a flowchart diagram of a method for fault detection of a solar photovoltaic system in an embodiment of the invention.

FIG. 4 is a flowchart diagram of a method for fault detection of a solar photovoltaic system in an embodiment of the invention. As shown, the method for fault detection of the solar photovoltaic system may include the following steps:

Performing step S401, where each micro-optimizer 102 transmits its input parameters and output parameters to the manager 103, wherein the input parameters and output parameters include the input current, the input voltage, the input power, the output current, the output voltage and the output power, etc., of the micro-optimizer 102;

Performing step S402, where the manager 103 processes and analyzes the output parameters;

Performing step S403, where it is determined whether the output parameters are abnormal or not, and if not, the method returns back to step S402, otherwise the method proceeds to step S404;

Performing step S404, where the manager 103 processes and analyzes the input parameters;

Performing step S405, where it is determined whether the input parameters are abnormal or not, and if not, performing step S406 and determining that the micro-optimizer 102 is in fault; otherwise performing step S407, and determining that a photovoltaic assembly 101 connected thereto is in fault;

Performing step S408, where a fault alarm message is issued.

The installation of the solar photovoltaic system in this invention includes coupling the micro-optimizers to the photovoltaic assemblies, coupling the outputs of the micro-optimizers, coupling the manager and the micro-optimizers for communication, etc. During installation, the micro-optimizers' numberings, the string numberings and the string voltages are stored in a memory of the manager, for subsequent control and analysis by the system. Other installation parameters, such as the photovoltaic assembly numberings, the locations, orientations, and inclinations of the photovoltaic assemblies, etc., may also be stored in the memory of the manager, for subsequent control and analysis by the system.

The micro-optimizers may be installed at the installation of a brand new photovoltaic system, or may be added to an existing photovoltaic system. For an existing photovoltaic system, since the overall output voltage of a string of micro-optimizers can be determined by the manager, the existing inverters can still be used.

The solar photovoltaic system of the invention harvests the maximum power generated by each photovoltaic assembly, and various photovoltaic assemblies with different models and rated power, and even from different suppliers and of materials, may be used in the same photovoltaic system.

This invention allows the photovoltaic assemblies to be installed under different conditions, such as illumination, temperature, orientations, etc., thereby simplifying the design of the photovoltaic system.

The output voltage of a string of micro-optimizers in the invention may be set flexibly depending on different system requirements, and the fixed DC voltage output to the inverter may be set flexibly, thereby optimizing the performance of the inverter.

The invention may also detect performance and failure of each photovoltaic assembly and micro-optimizer at any time.

The invention has been disclosed above with preferred embodiments, which are not intended to limit the invention. Possible variations and modifications can be made by those skilled in the art without departing from the spirit and scope of the invention. Accordingly, any contents compliant with the technical solutions of this invention, any variations to the above embodiments made in accordance with the technical nature of this invention, the equivalents and modifications thereof fall within the scope of the invention as defined by the Claims.

The invention claimed is:

1. A method for energy harvest optimization of a solar photovoltaic system, comprising the steps of:
   A. reading a respective string output voltage desired for each of at least one or more strings of micro-optimizers by a manager;
   B. tracking a maximum power point for a photovoltaic assembly by each of the micro-optimizers, such that the photovoltaic assembly can provide maximum power;
   C. detecting parameters of an input current or input voltage, and calculating acquired input power by each of the micro-optimizers;
   D. calculating acquired output power according to the input power by each of the micro-optimizers wherein for each string of micro-optimizers, the output power is calculated based on the following equation:

$Po(T)=k*Pi(T)$ wherein Po(T) is the output power of each string of micro-optimizers, Pi(T) is the input power of each string of micro-optimizers, and k is a preset power conversion efficiency;
   E. transmitting their output power to the manager by all the micro-optimizers;
   F. putting data on the output power for each string into one set, based on numberings of the micro-optimizers by the manager;
   G. calculating a sum of the output power for each string of micro-optimizers by the manager;
   H. comparing the output power sum obtained at present detection time with the output power sum obtained at last detection time, and if the difference is not larger than a threshold, returning back to the step E, otherwise proceeding to step I;
   I. calculating a string output current desired for each string of micro-optimizers by the manager wherein the string output current desired for each string of micro-optimizers is calculated based on the following equation:

$Im(T)=Pm(T)/Vc$ wherein Im(T) is the string output current desired for the string of micro-optimizers, Pm(T) is the sum of the output power for the string of micro-optimizers, and Vc is the string output voltage desired for the string of micro-optimizers;
   J. transmitting the desired string output current to the micro-optimizer corresponding to the photovoltaic assembly as a management command by the manager;
   K. receiving the management command, controlling its power conversion circuit for DC-DC conversion by the micro-optimizer, such that the string output current is as desired; and
   L. returning back to the step B, such that the method repeats in loop.

2. The method for energy harvest optimization of claim 1, wherein the string output voltage desired for each string of micro-optimizers is input manually into the manager, or is be obtained by the manager automatically detecting an inverter or DC power grid connected to the string of micro-optimizers.

* * * * *